(12) United States Patent
Kim (10) Patent No.: US 8,519,709 B2
(45) Date of Patent: Aug. 27, 2013

(54) SYSTEM, METHOD AND COMPUTER ACCESSIBLE MEDIUM FOR PROVIDING HYBRID ADIABATIC-RECTANGULAR PULSE TRAIN FOR EFFECTIVELY COMPLETE SATURATION OF MAGNETIZATION WITHIN AN ANATOMICAL STRUCTURE

(75) Inventor: Daniel Kim, Hackensack, NJ (US)

(73) Assignee: New York University, New York, NY (US)

( * ) Notice: Subject to any disclaimer, the term of this patent is extended or adjusted under 35 U.S.C. 154(b) by 629 days.

(21) Appl. No.: 12/754,440

(22) Filed: Apr. 5, 2010

(65) Prior Publication Data

US 2010/0253343 A1  Oct. 7, 2010

Related U.S. Application Data

(60) Provisional application No. 61/166,393, filed on Apr. 3, 2009.

(51) Int. Cl.
*G01V 3/00* (2006.01)
*G01R 33/44* (2006.01)

(52) U.S. Cl.
USPC ........... 324/309; 324/307; 324/318; 600/410; 382/131

(58) Field of Classification Search
USPC .. 324/300–322; 600/407–465; 382/128–131
See application file for complete search history.

(56) References Cited

U.S. PATENT DOCUMENTS

| | | | |
|---|---|---|---|
| 6,750,649 B1 * | 6/2004 | Rosenfeld | 324/307 |
| 7,787,930 B2 * | 8/2010 | Nezafat et al. | 600/410 |
| 7,863,898 B2 * | 1/2011 | Park | 324/309 |
| 2005/0024052 A1 * | 2/2005 | Bendall et al. | 324/307 |
| 2010/0127703 A1 * | 5/2010 | Sung et al. | 324/309 |

OTHER PUBLICATIONS

Cheng, Adrian S.H. et al., "Cardiovascular Magnetic Resonance Perfusion Imaging at 3-Tesla for the Detection of Coronary Artery Disease: A Comparison with 1.5-Tesla", Journal of the American College of Cardiology, Jun. 26, 2007, vol. 49—No. 25, pp. 2440-2449.
Noeske, R. et al., "Human cardiac imaging at 3 Tesla using phased array coils", Proc. Intl. Soc. Mag. Reson. Med. 8, 2000, p. 1622.
Sung, Kyunghyun et al., "Measurement and Characterization of RF Nonuniformity Over the Heart at 3T Using Body Coil Transmission", Journal of Magnetic Resonance Imaging, 2008, vol. 27, pp. 643-648.
Sung, Kyunghyun et al., "The design and use of tailored hard-pulse trains for uniform saturation of myocardium at 3 Tesla." Magnetic Resonance in Medicine, 2008, vol. 60, pp. 997-1002.

* cited by examiner

*Primary Examiner* — Melissa Koval
*Assistant Examiner* — Emily Chan
(74) *Attorney, Agent, or Firm* — Dorsey & Whitney LLP (57) ABSTRACT

System, method and computer-accessible medium can be provided to facilitate a hybrid adiabatic-rectangular pulse train for saturation of magnetization within an anatomical structure. -Using such exemplary embodiments, it is possible to determine information by combining a first information associated with a first nonselective rectangular radio frequency (RF) pulse, a second information associated with a second nonselective rectangular RF pulse, and a third information associated with a nonselective adiabatic half-passage pulse. Further, it is possible to rotate the longitudinal magnetization onto a particular plane (e.g., the transverse plane) based on the information. In addition, it is possible to minimize and/or achieve the residual longitudinal magnetization to be less than a predetermined threshold value (e.g., 2% of equilibrium magnetization) within the anatomical structure using a configuration of RF pulses.

22 Claims, 9 Drawing Sheets

SYSTEM, METHOD AND COMPUTER ACCESSIBLE MEDIUM FOR PROVIDING HYBRID ADIABATIC-RECTANGULAR PULSE TRAIN FOR EFFECTIVELY COMPLETE SATURATION OF MAGNETIZATION WITHIN AN ANATOMICAL STRUCTURE

CROSS-REFERENCE TO RELATED APPLICATION(S)

The present application relates to and claims priority from U.S. Patent Application No. 61/166,393 filed Apr. 3, 2009, the entire disclosure of which is hereby incorporated herein by reference.

FIELD OF THE DISCLOSURE

The present disclosure relates generally to exemplary embodiments of systems, apparatus, methods and computer-accessible medium related to magnetic resonance imaging, and more particularly to exemplary embodiments of the system, apparatus, method and computer accessible medium for providing a hybrid adiabatic-rectangular pulse train for saturation of magnetization within an anatomical structure.

BACKGROUND INFORMATION

A recent publication indicates that the diagnostic performance of first-pass cardiac perfusion MRI is better at 3 T than at 1.5 T, for the identification of both single and multiple vessel coronary disease (see, e.g., Cheng et al., *Cardiovascular magnetic resonance perfusion imaging at 3-tesla for the detection of coronary artery disease: a comparison with 1.5-teslam*, Journal of the American College of Cardiology; 49(25), 2440-2449 (2007)). However, transmit radio-frequency (RF) field ($B_1^+$) variations and static magnetic field ($B_0$) variations can be comparatively higher at 3 T than at 1.5 T (see, e.g., (see, e.g., Greenman R L et al., *Double inversion black-blood fast spin-echo imaging of the human heart: a comparison between 1.5T and 3.0T*, Journal of Magnetic Resonance Imaging 2003; 17(6):648-655.; Noeske R, Seifert F et al., *Human cardiac imaging at 3 T using phased array coils*. Magnetic Resonance in Medicine 2000; 44(6):978-982; Singerman R W et al., *Simulation of B1 field distribution and intrinsic signal-to-noise in cardiac MRI as a function of static magnetic field*, Journal of Magnetic Resonance 1997; 125(1): 72-83; Schar M et al., *Cardiac SSFP imaging at 3 Tesla*, Magnetic Resonance in Medicine 2004; 51(4):799-806; Sung K, Nayak K S. *Measurement and characterization of RF nonuniformity over the heart at 3T using body coil transmission*, Journal of Magnetic Resonance Imaging 2008; 27(3): 643-648). Specifically, the peak-to-peak variation of $B_0$ within the heart at 3 T has been reported to be on the order of 130-260 Hz (see, e.g., Noeske R et al., supra.), and $B_1^+$ variation within the heart at 3 T has been indicated to be on the order of 50-80% (see, e.g., Singerman R W et al., supra.; Sung K et al., *Measurement and characterization of RF nonuniformity over the heart at 3T using body coil transmission*, Journal of Magnetic Resonance Imaging 2008; 27(3):643-648). These challenging factors make it more difficult to perform uniform $T_1$-weighting at 3 T using a conventional non-selective (e.g., 90°) pulse, which is known to be sensitive to both $B_0$ and $B_1^+$ inhomogeneities (see, e.g., Ernst RR et al., Bodenhausen G, Wokaun A. *Off-resonance effects due to finite pulse amplitude*. In: *Principles of nuclear magnetic resonance in one and two dimensions*. New York: Oxford University Press Inc.; 1987. p 119-124; Kim D, Cernicanu A et al., *B(0) and B(1)-insensitive uniform T(1)-weighting for quantitative, first-pass myocardial perfusion magnetic resonance imaging*, Magnetic Resonance in Medicine 2005; 54(6):1423-1429; Kim D, Gonen O et al., *Comparison of the effectiveness of saturation pulses in the heart at 3T*, Magnetic Resonance in Medicine 2008; 59(1):209-215).

Non-uniform $T_1$-weighting can be disadvantageous for both the interpretation and quantitative analysis of first-pass cardiac perfusion MR images. Given the limitations of commercially available automated $B_0$ shimming and RF calibration procedures for the heart, it can be important to design robust saturation pulses that can be insensitive to clinically relevant $B_0$ and $B_1^+$ variations within the heart at 3 T. Previously proposed adiabatic $B_1$-insensitive rotation (BIR-4) (see, e.g., Kim D, Gonen O et al., supra.; Staewen R S et al., *3-D FLASH imaging using a single surface coil and a new adiabatic pulse, BIR-4*, Investigative Radiology 1990; 25(5): 559-567) pulse, RF pulse train of three non-selective 90° pulses (see, e.g., Kim D, Gonen O et al., supra.; Oesingmann N et al., *Improved saturation RF pulse design for myocardial first-pass perfusion at 3T*, Journal of Cardiovascular Magnetic Resonance 2004; 6(1):373-374) and RF pulse train of three non-selective pulses with different flip angles (e.g., 96°, 228°, 141°) (see, e.g., Sung K et al., *Design and use of tailored hard-pulse trains for uniform saturation of myocardium at 3 Tesla*, Magnetic Resonance in Medicine 2008; 60:997-1002) can be used to improve the efficacy compared with a conventional non-selective 90° pulse, but at the expense of relatively longer pulse duration and higher specific absorption rate (SAR). For convenience, the pulse train of three non-selective 90° pulses can be referred to as the standard pulse train, and the pulse train of three non-selective pulses with different flip angles will be referred to as the tailored pulse train. The longer pulse duration (10-12 ms) can be inconsequential because a typical perfusion image acquisition time is on the order of 120-150 ms.

A higher SAR can likely be a significant limitation for a BIR-4 pulse (see, e.g., Kim D, Gonen O et al., supra.) because it can limit the nominal $B_1^+$ of the pulse and also reduces the slice coverage. An advantage of both standard and tailored pulse trains can be that their RF deposition levels can be considerably lower than that of a BIR-4 pulse (see, e.g., Kim D, Gonen O et al., supra.; Sung K et al., *Design and use of tailored hard-pulse trains for uniform saturation of myocardium at 3 Tesla*, Magnetic Resonance in Medicine 2008; 60:997-1002). A standard pulse train can be used to perform uniform saturation of magnetization within the left ventricle (LV), but not within the right ventricle (RV), where the $B_1^+$ variation is comparatively higher (see, e.g., Greenman R L et al., supra.); Kim D, Gonen O et al., supra.; Sung K et al., *Design and use of tailored hard-pulse trains for uniform saturation of myocardium at 3 Tesla*, Magnetic Resonance in Medicine 2008; 60:997-1002). As an extension of the WET (water suppression enhanced through $T_1$ effects) pulse (see, e.g., Ogg R J et al., *WET, a T1- and B1-insensitive water-suppression method for in vivo localized 1H NMR spectroscopy*, Journal of Magnetic Resonance Series B 1994; 104(1): 1-10), a particular publication (see, e.g., Sung K et al., *Design and use of tailored hard-pulse trains for uniform saturation of myocardium at 3 Tesla*, Magnetic Resonance in Medicine 2008; 60:997-1002) describes a tailored pulse train to numerically optimize the three flip angle values in order to minimize the residual longitudinal magnetization ($M_{ZR}$), which can be calculated as longitudinal magnetization ($M_z$) divided by the equilibrium magnetization ($M_0$). The tailored pulse train design was likely based on prior measurements of $B_0$ ranging from $\pm 140$ Hz and $B_1^+$ scale ranging from 0.4-1.2 (i.e., $B_1^+$ scale=1.0 represents true $B_1^+$). However, this can be at the expense of producing medium level of non-uniform residual magnetization within this range (see FIG. 3 in Ref. 12; see FIGS. 2-3) and slightly higher SAR than that of a standard pulse train (see, e.g., Sung K et al., *Design and use of tailored hard-pulse trains for uniform saturation of myocardium at 3 Tesla*, Magnetic Resonance in Medicine 2008; 60:997-1002).

Despite such improvements, these pulses described in such publications are likely incapable of performing complete saturation of magnetization within the whole heart at 3 T while remaining within clinically acceptable SAR limits. One of the objects of the present disclosure is to provide a hybrid adiabatic-rectangular pulse train that can achieve both of the aforementioned objectives at 3 T and evaluate its efficacy and predicted SAR against those of the standard pulse train, tailored pulse train, and BIR-4 pulses.

SUMMARY OF EXEMPLARY EMBODIMENTS OF THE DISCLOSURE

Indeed, one of the objects of certain exemplary embodiments of the present disclosure can be to address the exemplary problems described herein above, and/or to overcome the exemplary deficiencies commonly associated with the prior art as, e.g., described herein. For example, another object of the present disclosure is to provide an exemplary embodiment of a hybrid adiabatic-rectangular pulse train that can achieve both of the aforementioned objectives at 3 T and evaluate its efficacy and predicted SAR against those of the standard pulse train, tailored pulse train, and BIR-4 pulses.

According to exemplary embodiments of the present disclosure, system, method and computer-accessible medium can be provided which utilizes a hybrid adiabatic-rectangular pulse train. A standard pulse train, tailored pulse train, hybrid pulse train, and BIR-4 pulses were evaluated through numerical, phantom, and in vivo experiments. For example, only the hybrid pulse train can perform effectively complete saturation of magnetization within the whole heart while remaining within clinically acceptable SAR limits (e.g., safety limits) for multi-slice first-pass cardiac perfusion magnetic resonance imaging.

In addition, according to certain exemplary embodiments according to the present disclosure, exemplary computer-accessible medium can be provided having instructions thereon for providing a hybrid adiabatic-rectangular pulse train for saturation of the longitudinal magnetization within an anatomical structure. When a computing arrangement executes the instructions, the computing arrangement can be configured to, e.g., determine information by combining a first information associated with a first nonselective rectangular radio frequency (RF) pulse, a second information associated with a second nonselective rectangular RF pulse, and a third information associated with a nonselective adiabatic half-passage pulse. The computing arrangement can be further configured to rotate the longitudinal magnetization onto a particular plane (e.g. the transverse plane) based on the information, and minimize the, and/or achieve an adjusted, residual longitudinal magnetization to be less than a predetermined threshold value (e.g., 2% of equilibrium magnetization) within the anatomical structure using a configuration of RF pulses.

In certain exemplary embodiments acceding to the present disclosure, the first nonselective rectangular RF pulse can be configured to produce lower RF energy deposition than the second nonselective rectangular RF pulse. It is also possible that the second nonselective rectangular RF pulse can be configured to produce lower RF energy deposition than the first nonselective rectangular RF pulse. The nonselective adiabatic half-passage pulse can be configured to produce higher RF energy deposition than the first nonselective rectangular RF pulse and/or the second nonselective rectangular RF pulse. Thus, the first and second nonselective rectangular RF pulses can be configured to produce lower RF energy deposition than the nonselective adiabatic half-passage pulse.

According to certain exemplary embodiments of the present disclosure, the saturation of the longitudinal magnetization using a hybrid adiabatic-rectangular pulse train can involve, e.g., transmitting a RF field to a subject through a transmit coil configured to be used in a magnetic field of, e.g., at least 3 Tesla, 7 Tesla, 11 Tesla, etc. The computing arrangement can be further configured to utilize the saturation RF pulse to achieve the residual longitudinal magnetization that is less than a particular threshold value (e.g, 2% of equilibrium magnetization) within an anatomical structure, which can be, e.g., a human body, including at least one of the heart, the liver, the kidney, or the abdomen. The rotation of the longitudinal magnetization onto the transverse plane can be influenced by expected RF field and static magnetic field inhomogeneities within the anatomical structure, for example.

The computing arrangement can be further configured to generate an image of the anatomical structure based on information associated with uniform saturation of the magnetization. Further, according to certain exemplary embodiments of the present disclosure, the usage of the configuration of RF pulses can utilize a predetermined SAR that is within clinically acceptable safe limits for an acquisition of multiple slices per heart beat, for example. The computing arrangement can be further configured to extend the spatial coverage for saturation of magnetization such that multiple regions of interest associated with the image can be examined. For example, one of the regions of interests can be associated with the left ventricle of a heart, another region of interest can be associated with the right ventricle of the heart, and another region of interest can be associated with the liver.

Also provided herein is an exemplary embodiment of a method for providing a hybrid adiabatic-rectangular pulse train for saturation of magnetization within an anatomical structure, including, e.g., determining information by combining a first information associated with a first nonselective rectangular RF pulse, a second information associated with a second nonselective rectangular RF pulse, and a third information associated with a nonselective adiabatic half-passage pulse, rotating the longitudinal magnetization onto a particular plane (e.g., the transverse plane) based on the information, and minimizing the, and/or achieving a, residual longitudinal magnetization to be less than a predetermined threshold value (e.g., 2% of equilibrium magnetization) within the anatomical structure using a configuration of RF pulses. Exemplary embodiments according to the present disclosure can also provide for, e.g., the display and/or storage of (i) the first information, (ii) the second information, (iii) the third information, (iv) the fourth information, (v) the residual longitudinal magnetization based on (e.g., resulting from) the information, and/or (vi) further information associated with the anatomical structure in a storage arrangement in a user-accessible format and/or a user-readable format.

In yet another exemplary embodiment according to the present disclosure, a system is provided for providing a hybrid adiabatic-rectangular pulse train for saturation of magnetization within an anatomical structure, which can include, e.g., a computer-accessible medium having executable instructions thereon. For example, when the computing arrangement(s) executes the instructions, the computing arrangement(s) can be configured to determine information by combining a first information associated with a first nonselective rectangular radio frequency (RF) pulse, a second information associated with a second nonselective rectangular RF pulse, and a third information associated with a nonselective adiabatic half-passage pulse, rotate the longitudinal magnetization onto a particular plane (e.g., the transverse) plane based on the information, and minimize the, and/or achieving a, residual longitudinal magnetization to be less than a predetermined threshold value (e.g., 2% of equilibrium magnetization) within the anatomical structure using a configuration of RF pulses.

These and other objects, features and advantages of the present disclosure will become apparent upon reading the following detailed description of exemplary embodiments of the present disclosure, when taken in conjunction with the accompanying exemplary drawings and appended claims.

BRIEF DESCRIPTION OF THE DRAWINGS

The foregoing and other objects of the present disclosure will be apparent upon consideration of the following detailed description, taken in conjunction with the accompanying exemplary drawings and claims showing illustrative embodiments of the invention, in which:

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative embodiments. It is intended that changes and modifications can be made to the described embodiments without departing from the true scope and spirit of the subject disclosure.

DETAILED DESCRIPTION OF EXEMPLARY EMBODIMENTS

Exemplary Methods
Saturation Pulses

According to an exemplary embodiment of the present disclosure, a hybrid adiabatic-rectangular RF pulse train can be provided with the following exemplary subpulses, e.g., a non-selective rectangular 140° pulse, a non-selective rectangular 90° pulse, and a non-selective adiabatic half-passage (AHP) pulse (see, e.g., Garwood M et al., *B1 insensitive adiabatic RF pulses. In: NMR Basic Principles and Progress*. Volume 26, Berlin: Springer-Verlag; 1992. p 109-147; Bendall M et al., *Uniform sample excitation with surface coils for in vivo spectroscopy by adiabatic rapid half passage*, Journal of Magnetic Resonance 1986; 67:376-381). The non-selective rectangular pulse angles can be numerically optimized by minimizing the root-mean-square (RMS) $M_{ZR}$ for $B_0$ ranging from ±130 Hz (1 Hz steps) (see, e.g., Schar M et al., supra.) and $B_1^+$ scale ranging from 0.5-1.1 (0.01 steps) (see, e.g., Sung K et al., *Measurement and characterization of RF non-uniformity over the heart at 3T using body coil transmission*, Journal of Magnetic Resonance Imaging 2008; 27(3):643-648), with each non-selective rectangular pulse angle ranging from 80-200° (5° steps). The frequency sweep of the AHP pulse can be, e.g., ±16.7 kHz, and its nominal $B_1^+$ calibrated by the transmit body coil can be, e.g., about 667 Hz (see, e.g., Garwood M et al., supra.) (e.g., about 49% larger than the 447 Hz frequency difference between the fat and water signal at 3 T). The net effect of such exemplary subpulses can provide a relatively strong immunity to clinically relevant $B_0$ and $B_1^+$ variations within the heart at 3 T.

Previous studies indicated that a single BIR-4 pulse with pulse duration of approximately 8 ms is likely incapable of performing complete saturation of magnetization within the whole heart at 3 T (see, e.g., Kim D, Gonen O et al., supra.; Sung K et al., *Design and use of tailored hard-pulse trains for uniform saturation of myocardium at 3 Tesla*, Magnetic Resonance in Medicine 2008; 60:997-1002; Cunningham C H et al., *Saturated double-angle method for rapid B1+ mapping*, Magnetic Resonance in Medicine 2006; 55(6):1326-1333). Thus, according to an exemplary embodiment of the present disclosure, it is possible to apply the previously-described BIR-4 pulse (see, e.g., Kim D, Gonen O et al., supra.) twice, as described by Cunningham et al. (see, e.g., Cunningham et al., supra.), to perform complete the saturation of the magnetization within the whole heart, and utilize the results of the saturation as the reference to evaluate the efficacy of other three pulses. The frequency sweep of the BIR-4 pulse can be, e.g., ±12.5 kHz, and its nominal $B_1^+$ calibrated by the transmit body coil can be about 500 Hz (see, e.g., Garwood M et al., supra.) (e.g., about 12% larger than the 447 Hz frequency difference between the fat and water signal at 3 T).

For example, according to one exemplary embodiment of the present disclosure, the standard pulse train (see, e.g., Kim D, Gonen O et al., supra.; Oesingmann N et al., supra.) tailored pulse train (see, e.g., Sung K et al., *Design and use of tailored hard-pulse trains for uniform saturation of myocardium at 3 Tesla*, Magnetic Resonance in Medicine 2008; 60:997-1002), hybrid pulse train, and BIR-4 (2×) pulses can be implemented on a 3 T whole-body MR scanner (Tim Trio, Siemens Medical Solutions, Erlangen, Germany), equipped with a gradient system capable of achieving a maximum gradient strength of 45 mT/m and a slew rate of 200 T/m/s. The RF excitation can be performed using the transmit body coil, and 6-element anterior and 6-element posterior phased arrays were used for signal reception. The commercially available automated RF calibration, which determines the RF power needed for a 1 ms non-selective, rectangular inversion pulse, i.e., a $B_1^+$ of 500 Hz, can be performed prior to the image acquisition. The transmitted RF energy can depend on several variables, including: linearity of the RF power amplifier, efficacy of the transmit body coil, and patient body. Therefore, the relative RF energy of each pulse can be calculated as its RF energy divided by the RF energy of the corresponding standard RF pulse train, which is then by definition a "1." The relative RF energy of the tailored pulse train, hybrid pulse train, and BIR-4 (2×) can be 1.65, 2.45, and 10.66, respectively.

The exemplary pulse trains can be comprised of, e.g., the same following gradient pulses in succession: 1 ms long spoiler gradients (magnitude of net zeroth gradient moment=15 mT/m·ms), 3 ms long crusher gradients (magnitude of net zeroth gradient moment=75 mT/m·ms), 2 ms long crusher gradients (magnitude of net zeroth gradient moment=45 mT/m·ms), and 3 ms long spoiler gradients (magnitude of net zeroth gradient moment=75 mT/m·ms). The BIR-4 (2×) pulse can use the same or similar spoiler and crusher gradients, except that it used only the first set of crusher gradients (magnitude of net zeroth gradient moment=75 mT/m·ms). The exemplary spoiler gradients can be applied before and after each saturation pulse to dephase the transverse magnetization, and the crusher gradients in between RF pulses can be cycled to eliminate stimulated echoes.

FIGS. 1(a)-1(d) show exemplary pulse sequence diagrams 100, 110, 120, 130 of a standard pulse train, a tailored pulse train, a hybrid pulse train, and a BIR-4 (2×) pulse, respectively, in accordance with the exemplary embodiments of the present disclosure. Exemplary spoiler gradients can be applied before and after each saturation pulse to dephase the transverse magnetization. Exemplary crusher gradients in between RF pulses can be cycled to eliminate stimulated echoes. Exemplary diagrams 100, 110, 120, 130 of FIGS. 1(a)-1(d) can be drawn to approximate proportions that may not necessarily be to an exact scale. Lines 101, 111, 121, 131 of diagrams 100, 110, 120, 130 shown in of FIGS. 1(a)-1(d), respectively, represent an exemplary radio frequency RF. In addition, lines 102, 112, 122, 132 in diagrams 100, 110, 120, 130, respectively, represent an exemplary slice-select gradient $G_{SS}$. Lines 103, 113, 123, 133 in diagrams 100, 110, 120, 130, respectively, represent an exemplary phase-encoding gradient $G_{PE}$. Lines 104, 114, 124, 134 in diagrams 100, 110, 120, 130, respectively, represent an exemplary frequency-encoding gradient $G_{FE}$. The corresponding exemplary RF pulse characteristics are described in the exemplary Table 1 provided herein.

For example, Table 1 provides a summary of exemplary RF pulse characteristics of the standard pulse train, tailored pulse train, hybrid pulse train, and BIR-4 (2×) pulses shown in FIGS. 1(a)-1(d), respectively. Each pulse can be preceded by 1 ms long spoiler gradient and followed by 3 ms long spoiler gradient. For each pulse train, e.g., the first and second crusher gradient durations can be 3 and 2 ms, respectively. For the hybrid train, the last subpulse can be an AHP pulse. For the BIR-4 (2×) pulse, the first set of crusher gradients can be employed. In this example, $B_1^+$ represents an exemplary peak nominal value.

EXEMPLARY TABLE 1

| | Angle (°) | Duration (ms) | $B_1^+$ (Hz) | Total Relative RF Energy | Total Duration (ms) |
|---|---|---|---|---|---|
| Standard Train | 90 | 0.5 | 500 | 1 | 10.5 |
| | 90 | 0.5 | 500 | | |
| | 90 | 0.5 | 500 | | |
| Tailored Train | 96 | 0.6 | 444.44 | 1.65 | 11.7 |
| | 228 | 1.3 | 487.18 | | |
| | 141 | 0.8 | 489.58 | | |
| Hybrid Train | 140 | 0.8 | 486.11 | 2.47 | 11.8 |
| | 90 | 0.5 | 500 | | |
| | 90 (AHP) | 1.54 | 666.67 | | |
| BIR-4 (2x) | 90 | 8.1 | 500 | 10.66 | 23.2 |
| | 90 | 8.1 | 500 | | |

Figure 1A:
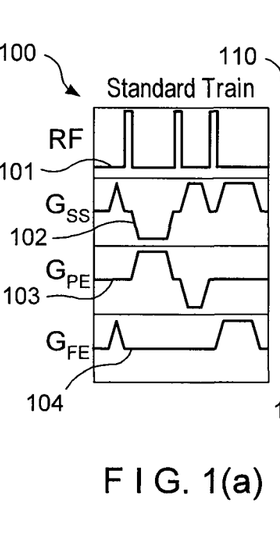
FIG. 1(a) is an exemplary pulse sequence diagram of a standard pulse train, in accordance with the exemplary embodiments of the present disclosure.
Figure 1B:
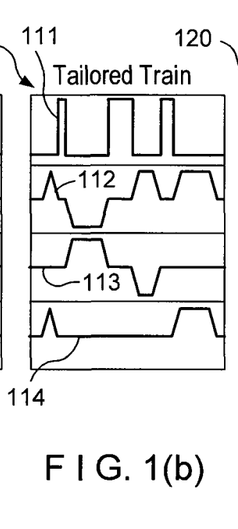
FIG. 1(b) is an exemplary pulse sequence diagram of a tailored pulse train, in accordance with the exemplary embodiments of the present disclosure.
Figure 1C:
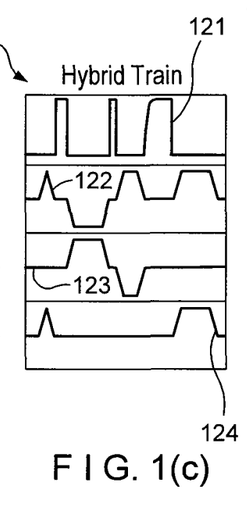
FIG. 1(c) is an exemplary pulse sequence diagram of a hybrid pulse train, in accordance with the exemplary embodiments of the present disclosure.
Figure 1D:
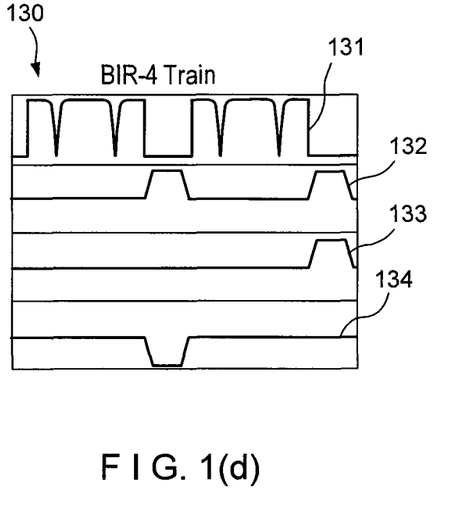
FIG. 1(d) is an exemplary pulse sequence diagram of a BIR-4 (2×) pulse, in accordance with the exemplary embodiments of the present disclosure.
Figures 2A, 2B, 2C, 2E, 2F, 2G:
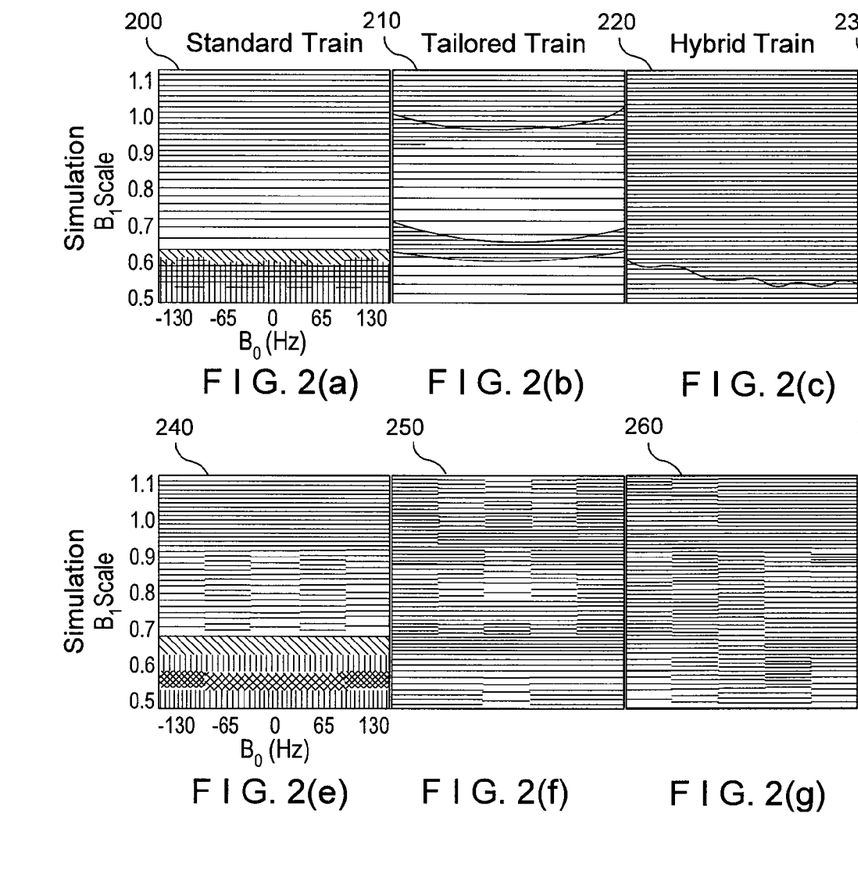
FIGS. 2(a)-2(d) are exemplary simulated $M_{ZR}$ maps as a function of $B_0$ and $B_1^+$ scales, in accordance with the exemplary embodiments of the present disclosure.
FIGS. 2(e)-2(h) are further exemplary $M_{ZR}$ maps of an exemplary phantom as a function of $B_0$ and $B_1^+$ scales, in accordance with the exemplary embodiments of the present disclosure.
Figures 2D, 2H:
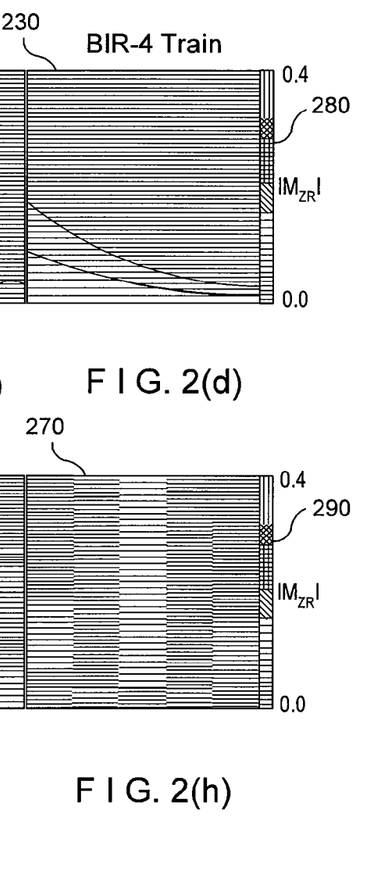

FIGS. 2(a)-2(d) show exemplary simulated $M_{ZR}$ maps 200, 210, 220, 230 as a function of $B_0$ and $B_1^+$ scales. FIGS. 2(e)-2(h) show exemplary $M_{ZR}$ maps 240, 250, 260, 270, respectively, of an exemplary phantom as a function of $B_0$ and $B_1^+$ scales. As shown in FIGS. 2(a) and 2(e), respective exemplary maps 200 and 240 correspond to a standard pulse train for the exemplary simulation and phantom. Exemplary maps 210 and 250 of FIGS. 2(b) and 2(f), respectively, correspond to a tailored pulse train for the exemplary simulation and phantom. Exemplary maps 220 and 260 of FIGS. 2(c) and 2(g), respectively, correspond to a hybrid tailored pulse train for the exemplary simulation and phantom. Further, exemplary maps 230 and 270 of FIGS. 2(d) and 2(g), respectively, correspond to BIR-4 (2×) pulses for the exemplary simulation and phantom.

As shown in FIGS. 2(a)-2(h), comparing maps 200, 210, 220, 230 to maps 240, 250, 260, 270, respectively, the corresponding phantom $M_{ZR}$ maps can be sees as being in agreement. As also shown in these figures, as compared to the standard pulse train and tailored pulse train, both the hybrid pulse train and the BIR-4 (2×) pulses can yield considerably lower $M_{ZR}$ maps. Exemplary RMS $M_{ZR}$ measurement results can be 0.136, 0.055, 0.013, and 0.012 for the standard train, tailored train, hybrid train, and BIR-4 (2×) pulses, respectively.

Exemplary $M_{ZR}$ scales 280, 290 of FIGS. 2(a)-2(d) and FIGS. 2(e)-2(h), respectively, are provided for the respective associated exemplary maps 200, 210, 220, 230, and 240, 250, 260, 270, respectively. According to exemplary scales 280, 290, for example, RMS $M_{ZR}$ measurement results of the exemplary simulation can be, e.g., 0.136, 0.055, 0.013, and 0.001 for the standard train, tailored train, hybrid train, and BIR-4 (2×) pulses, respectively. The resulting RMS $M_{ZR}$ measurements of the exemplary phantom can be, e.g., 0.164, 0.053, 0.035, and 0.016 for the standard train, tailored train, hybrid train, and BIR-4 (2×) pulses, respectively.

Figure 3A:
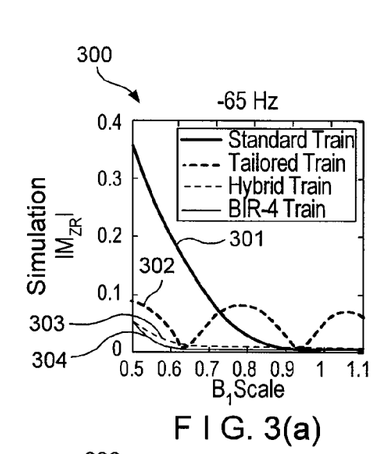
FIGS. 3(a)-3(f) are exemplary graphs that show corresponding exemplary $M_{ZR}$ maps of the phantom as a function of the $B_0$ and $B_1^+$ scales illustrated in FIGS. 2(a)-2(h), in accordance with the exemplary embodiments of the present disclosure.
Figure 3B:
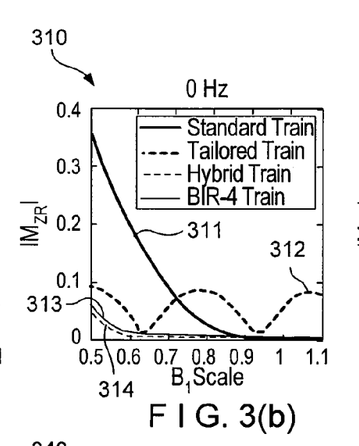
Figure 3C:
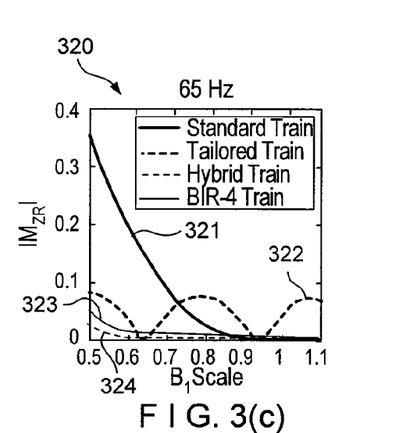
Figure 3D:
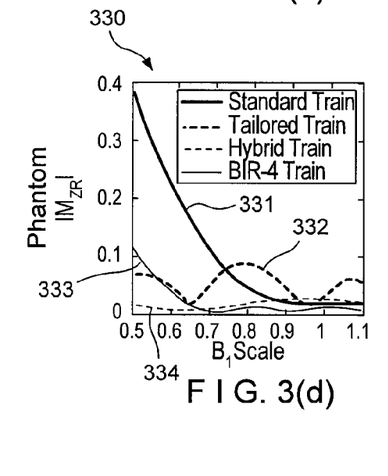
Figure 3E:
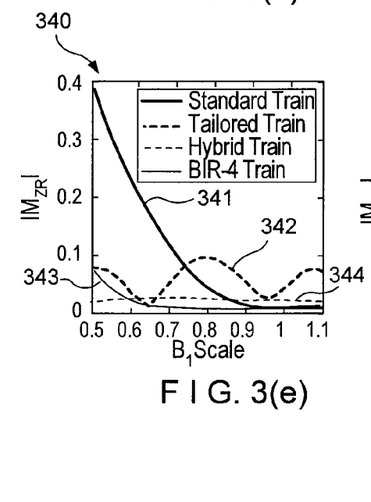
Figure 3F:
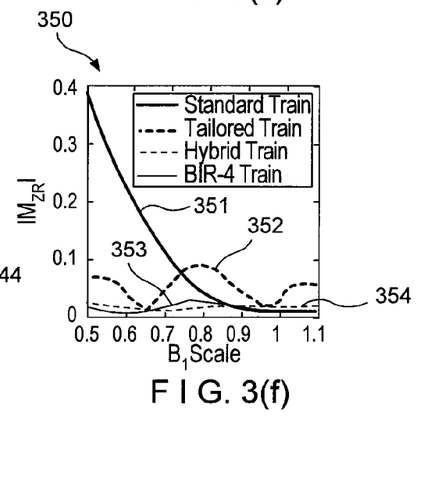

FIGS. 3(a)-3(c) show exemplary simulated graphs 300, 310, 320 as a function of $B_0$ and $B_1^+$ scales of FIGS. 2(a)-2(d). FIGS. 3(d)-3(f) show exemplary graphs 330, 340, 350 as a function of $B_0$ and $B_1^+$ scales of FIGS. 2(e)-2(h).

For example, FIGS. 3(a)-3(c) show exemplary numerically simulated profiles of $M_{ZR}$ as a function of $B_1^+$ scale at −65 Hz, 0 Hz, and 65 Hz off-resonance, respectively. FIGS. 3(d)-3(f) show exemplary corresponding profiles of $M_{ZR}$ in the exemplary phantom as a function of $B_1$ scale at −65 Hz, 0 Hz, and 65 Hz off-resonance, respectively. As shown in FIG. 3(a), for example, lines 301, 302, 303, 304 represent the simulated Standard Train, Tailored Train, Hybrid Train and BIR-4 Train at −65 Hz off-resonance, respectively. Exemplary lines 311, 312, 313, 314 of FIG. 3(b) represent the simulated Standard Train, Tailored Train, Hybrid Train and BIR-4 Train at 0 Hz, respectively, and Exemplary lines 321, 322, 323, 324 of FIG. 3(c) represent the simulated Standard Train, Tailored Train, Hybrid Train and BIR-4 Train at 65 Hz off-resonance, respectively. As shown in FIG. 3(d), exemplary lines 331, 332, 333, 334 of FIG. 3(d) represent the phantom Standard Train, Tailored Train, Hybrid Train and BIR-4 Train at −65 Hz off-resonance, respectively. FIGS. 3(e) and 3(f) show that exemplary lines 341, 342, 343, 344 represent the simulated Standard Train, Tailored Train, Hybrid Train and BIR-4 Train at 0 Hz, respectively, and that exemplary lines 351, 352, 353, 354 represent the simulated Standard Train, Tailored Train, Hybrid Train and BIR-4 Train at 65 Hz off-resonance, respectively. As shown FIGS. 3(a)-3(f), the standard pulse train can yield lower $M_{ZR}$ than the tailored pulse train for $B_1^+$ scales>0.72, and vice versa for $B_1^+$ scales<0.72. In contrast, the hybrid pulse train and BIR-4 pulse train yielded considerably lower $M_{ZR}$ throughout the $B_1^+$ scale.

Exemplary Pulse Sequence

Exemplary $M_{ZR}$ after applying a saturation pulse can be measured by performing saturation-recovery (SR) ultra-fast gradient echo (i.e., TurboFLASH) imaging with "zero" recovery and centric k-space reordering, as previously described (see, e.g., Kim D, Gonen O et al., supra.). Relevant exemplary imaging parameters can include, e.g.: field of view (FOV)=340×276 mm, acquisition matrix=64×52, slice thickness=8 mm, TE/TR=1.1/2.3 ms, saturation recovery time delay (TD)=3 ms, image acquisition time=78 ms, flip angle=10°, generalized autocalibrating partially parallel acquisitions (GRAPPA) (see, e.g., Griswold M A et al., *Generalized autocalibrating partially parallel acquisitions (GRAPPA)*, Magnetic Resonance in Medicine 2002; 47(6): 1202-1210) with an acceleration factor=1.5, and receiver bandwidth=1002 Hz/pixel. Proton density (PD) image acquired using 4° flip angle and without the saturation pulse, in order to perform image normalization, as described herein.

Exemplary Numerical Simulation

Exemplary $M_{zr}$ after applying each saturation pulse can be simulated for $B_0$ ranging from ±130 Hz (3 Hz steps) (see, e.g., Schar M et al., supra.) and $B_1^+$ scale ranging from 0.5-1.1 (0.5 steps) (see, e.g., Sung K et al., *Measurement and characterization of RF nonuniformity over the heart at 3T using body coil transmission*, Journal of Magnetic Resonance Imaging 2008; 27(3):643-648). The numerical simulation can be performed by ignoring $T_1$ relaxation between subpulses (i.e., during crusher gradient pulses), assuming complete dephasing of the transverse magnetization between subpulses, and with $M_0$ scalar equal to 1. For non-selective rectangular pulses, their $M_{ZR}$ can be calculated using the Bloch equations in the rotating frame. For example, the effective field and effective nutation angle can be calculated, as previously described (see, e.g., Ernst RR et al., supra.), using a customized code programmed in MATLAB® R2008a (Mathworks, Natick, Mass.). Another customized software programmed in visual C++® 6.0 (Microsoft Corporation©, Bellevue, Wash.) can be used to calculate the $M_{ZR}$ left behind by the AHP and BIR-4 (2×) pulses. Specifically, the actual RF pulse profiles (i.e., amplitude and phase) used by the MR scanner were analyzed to calculate the generalized solutions of the Bloch equations using the Laplace transformation, as previously described (see, e.g., Morris G et al., *General analytical solutions of the Bloch equations*, Journal of Magnetic Resonance 1994; 107(1):236-238). The simulation for the adiabatic pulses was performed by ignoring $T_1$ relaxation between subpulses, assuming adiabaticity, and with $T_1$=1000 ms, $T_2$=40 ms, and $M_0$ scalar equal to 1. For the standard pulse train, tailored pulse train, hybrid pulse train, and BIR-4 (2×) pulses, their net $M_{ZR}$ was calculated as $(M_{ZR}-90°)^3$, $M_{ZR}-96°×M_{ZR}-228°×M_{ZR}-141°$, $M_{ZR}-140°×M_{ZR}-90°×M_{ZR}-AHP$, and $(M_{ZR}-BIR-4)^2$, respectively. For each pulse, $M_{ZR}$ was plotted as a function of $B_0$ and $B_1^+$ scales, and the corresponding RMS $M_{ZR}$ was calculated.

Exemplary Phantom Imaging

Phantom procedures can be performed to evaluate the performance of the four saturation pulses. A spherical oil phantom ($T_1$=530 ms) was imaged to minimize the dielectric effects (see, e.g., Simmons A et al., *Sources of intensity non-uniformity in spin echo images at 1.5 T*, Magnetic Resonance in Medicine 32(1):121-8, 1994). The $T_1$ of such exemplary phantom can be calculated from a separate multi-point SR procedure. The image acquisition was performed in an axial plane at magnet isocenter, to achieve relatively homogeneous $B_1$ excitation within the phantom using the body coil. The $B_0$ offset can be manually adjusted to produce −130, −65, 0, 65, and 130 Hz off-resonance, in order to mimic clinically relevant $B_0$ variation within the heart at 3 T (see, e.g., Noeske R et al., supra.; Schar M et al., supra.). For each $B_0$ offset, the image acquisition can be repeated with $B_1^+$ scale of each saturation pulse manually adjusted from 0.5-1.1 (0.05 steps) of its nominally calibrated $B_1^+$ value, in order to determine the sensitivity of each saturation pulse to clinically relevant $B_0$ and $B_1^+$ variations within the heart (see, e.g., Noeske R et al., supra.; Singerman RW et al., supra.; Schar M et al., supra.; Sung K et al., *Measurement and characterization of RF non-uniformity over the heart at 3T using body coil transmission*, Journal of Magnetic Resonance Imaging 2008; 27(3):643-648). For each pulse, 60 $M_{ZR}$ measurements can be recorded using aforementioned $B_0$ and $B_1$ scales, with a repetition time of 4000 ms to allow a full recovery of magnetization between image acquisitions. The $M_{ZR}$ can be plotted as a function of $B_0$ and $B_1^+$ scales, and the corresponding RMS $M_{ZR}$ can be calculated.

Exemplary Cardiac Imaging

In accordance with certain exemplary embodiments of the present disclosure, nine healthy human subjects (7 males; 3 females; mean age=29.0±4.7 years; mean weight=68.8±8.9 kg) were imaged in 3 short-axis views (apical, mid-ventricular, and basal) of the LV and three long-axis views (2-chamber view of LV, 2-chamber view of RV, and 4-chamber). For imaging the 2-chamber view of the RV, with all other parameters being equal, the FOV was increased from 340 mm×276 mm to 400 mm×325 mm, in order to avoid aliasing artifacts. Human imaging was performed in accordance with exemplary protocols and procedures.

Electrocardiogram (ECG) gating can be used to acquire the images at mid diastole (trigger delay=500 ms), in order to minimize the effects of cardiac motion. For each cardiac view per saturation pulse, PD (heart beat 1) and SR (heart beat 8)

images were acquired with a breath-hold duration of approximately 8 s, with a wait time of 6 s to allow for full recovery of magnetization [>5×$T_1$; $T_1$ of myocardium=1150 ms at 3 T (see, e.g., Noeske R et al., supra.) between the two image acquisitions. This relatively short breath-hold duration ensured reliable registration of PD and SR images. For each subject, 24 separate breath-hold acquisitions were performed (e.g., 6 cardiac views×4 saturation pulses) with the magnet isocenter positioned at the mid-ventricular, short-axis plane. To optimally utilize the dynamic range of the 12-bit analog-to-digital converter (ADC), for each subject, the receiver gains were adjusted so that the maximum intensity of the PD image is approximately 80-90% of the maximum value of the ADC (i.e., 4095). This ensured that the signal of the SR image will be well above the noise. For each subject, the RF calibration, $B_0$ shimming, and receiver gains were maintained about the same between different SR image acquisitions, in order to permit $M_{ZR}$ comparisons.

A separate procedure can be conducted to measure the predicted SAR for each saturation pulse in multi-slice first-pass cardiac perfusion MRI without contrast. The saturation pulses can be incorporated into a TurboFLASH pulse sequence with the following relevant imaging parameters: FOV=350×285 mm, acquisition matrix=144×118 (59 acquired phase-encoding lines), spatial resolution=2.4 mm×2.4 mm, slice thickness=8 mm, TE/TR=1.2/2.34 ms, TD=10 ms, time-adaptive sensitivity encoding (TSENSE) (see, e.g., Kellman P et al., *Adaptive sensitivity encoding incorporating temporal filtering (TSENSE)*, Magnetic Resonance in Medicine 2001; 45(5):846-852) with an acceleration factor=2, image acquisition time=138 ms, total scan time (including TD, saturation pulse duration)~160 ms, flip angle=10°, repetitions=40, and receiver bandwidth=990 Hz/pixel. This exemplary procedure can be performed with a simulated heart rate of 60 beats per minute, in order to measure the predicted SAR and maximum allowable perfusion image acquisitions per cardiac cycle within clinically acceptable SAR limits, for all nine subjects using an identical total acquisition window of 1000 ms. In addition, SAR per slice can be calculated by dividing the SAR measurement by the maximum permitted number of slices.

Influence of Saturation Pulse on Accuracy of $T_1$-Weighted Imaging

An exemplary numerical simulation was performed to assess the influence of each saturation pulse on the accuracy of dynamic $T_1$-weighted imaging with the aforementioned TurboFLASH protocol. Specifically, for each pulse per ventricle, the simulation was performed with three cardiac $M_{ZR}$ measurements, as provided in exemplary Table 2, e.g., mean-standard deviation (SD), mean, and mean $M_{ZR}$+SD. For the $M_z$ calculation, the initial $M_z(0)$ after the saturation pulse and immediately prior to the TurboFLASH readout was defined as $M_z(0)=M_0+(M_{ZR}-M_0)e^{-TD/T_1}$, where $M_0$ scalar=1. This initial $M_z$ was then inputted to solve an iterative multiplication of rotation matrices in the rotating frame as a function of phase-encoding line. The simulation was performed with 10° excitation of a single isochromat at on-resonance and assumed complete dephasing of the transverse magnetization before the next RF excitation.

The $T_1$-weighted signal (S) was defined as $M_z$ at the center of k-space (21) (i.e., phase-encoding line=30; effective recovery time=80.2 ms), and this calculation was repeated for $T_1$ ranging 50-1150 ms (100 ms steps). The true $T_1$-weighted signal ($S_0$) was calculated with $M_{ZR}$=0, and the corresponding normalized signal was calculated as $S/S_0$ and plotted as a function of $T_1$.

Table 2 shows data related to an exemplary mean, maximum, and minimum $M_{ZR}$ left behind after nominal saturation. Each ROI can be considered to be an independent sample (n=45). Statistically, the mean $M_{ZR}$ within the LV and RV can be different between the pulse groups (p<0.001). Within each pair of groups, the mean $M_{ZR}$ within the LV can be significantly higher for the tailored pulse train than for the other three pulses (p<0.001), and the mean $M_{ZR}$ likely may not be different for any pair between the standard pulse train, hybrid pulse train, and BIR-4 (2×) pulses. Within the RV, the mean $M_{ZR}$ can be significantly higher for both the standard and tailored pulse trains than for either the hybrid pulse train or BIR-4 (2×) pulse (p<0.001), and likely not different between the standard and tailored pulse trains and between the hybrid pulse train and BIR-4 (2×) pulse.

EXEMPLARY TABLE 2

| Ventricle | | Standard Train | Tailored Train | Hybrid Train | BIR-4 (2×) |
|---|---|---|---|---|---|
| LV | Mean | 0.018 ± 0.008 | 0.048 ± 0.007 | 0.015 ± 0.005 | 0.016 ± 0.004 |
|    | Max  | 0.054 | 0.069 | 0.028 | 0.027 |
|    | Min  | 0.009 | 0.035 | 0.008 | 0.010 |
| RV | Mean | 0.069 ± 0.043 | 0.057 ± 0.012 | 0.018 ± 0.006 | 0.015 ± 0.005 |
|    | Max  | 0.195 | 0.079 | 0.042 | 0.032 |
|    | Min  | 0.013 | 0.026 | 0.009 | 0.007 |

Exemplary Image Analysis

SR Image Analysis

For signal normalization, the SR image (nominally zero signal) can be divided by the corresponding PD (nominally maximum signal) image on a pixel-by-pixel basis, in order to correct for signal variations due to the receiver coil sensitivity (i.e., $B_1^-$), $T_2^*$ decay, $B_1^+$ variation of the excitation pulse, imperfect slice profile, and underlying $M_0$, as previously described (see, e.g., Kim D, Cernicanu A et al., supra.; Kim D, Gonen O et al., supra.). The quotient image can be multiplied by the factor sin(4°)/sin(10°) to account for the difference in the two excitation angles. The resulting exemplary normalized image intensity conveniently can have a range of 0 (complete saturation) to 1 (no saturation).

For an exemplary phantom image analysis, a region of interest (ROI) can be manually drawn to cover the whole phantom, and the mean $M_{ZR}$ can be calculated for each ROI. For cardiac image analysis, an ROI can be manually drawn for the whole LV and/or RV per cardiac view, and the mean $M_{ZR}$ can be calculated for each ROI. For an exemplary statistical analysis, each ROI can be considered to be an independent sample, and the reported values can represent the mean±SD of averaged $M_{ZR}$ over ROIs. An exemplary single-factor analysis of variance can be used to compare the mean values between the four pulse groups (p<0.05 was considered to be significant), and the Tukey's honestly significant difference test can be used to compare the mean values between each pair of two groups (p<0.05 was considered to be significant). An exemplary statistical analysis can be performed using the SPSS 13.0 software (SPSS© Inc, Chicago, Ill.).

Exemplary Results

Exemplary results are shown in FIGS. 2(a)-2(h) and FIGS. 3(a)-3(f), for example. As described herein above, FIGS. 2(a)-2(h) show exemplary magnitudes of numerical $M_{ZR}$ maps as a function $B_0$ and $B_1^+$ scales for each of the four saturation pulses described herein above, and FIGS. 3(a)-3(f) show corresponding graphs.

Figure 4:
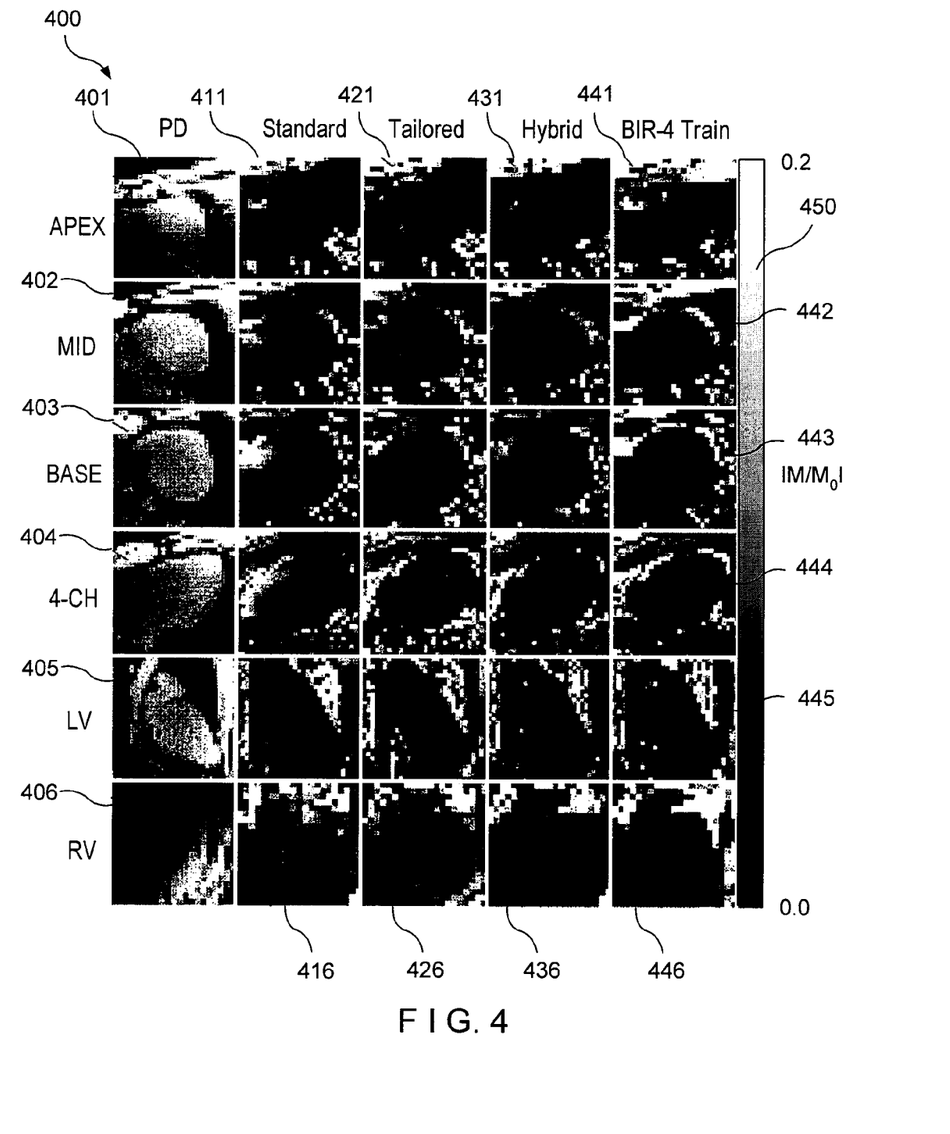
FIG. 4 is an illustration of a group of exemplary representative normalized saturation-recovery (SR) images of one subject in six cardiac views for four saturation pulses, in accordance with the exemplary embodiments of the present disclosure.

FIG. 4 shows exemplary representative normalized SR images 401-406, 411-416, 421-426, 431-436, 441-446 of one subject in six cardiac views (e.g., APEX, MID, BASE, 4-CH, LV, RV) for the four saturation pulses described herein above. As indicated by exemplary scale 450, the bright areas in the exemplary normalized images 401-406, 411-416, 421-426, 431-436, 441-446 represent the non-zero $M_{ZR}$, which can be undesirable and thus are remained from the effective flip angle variation due to $B_0$ and $B_1^+$ inhomogeneities. As shown in FIG. 4 by images 411-416, for example, the standard pulse train can perform well within the LV (dark regions of images 411-416) and poorly within the RV (bright regions images 411-416). The exemplary images 421-424 show that the exemplary tailored pulse train can perform similarly within the whole heart, but can produce medium level of non-uniform $M_{ZR}$ values (gray regions and dark bands in the images 421-426) within both ventricles. In contrast, exemplary images 431-436 and 441-446 show the hybrid RF pulse train and BIR-4 (2×) pulses can yield uniformly minimal $M_{ZR}$ within both ventricles (dark regions of the images 431-436 and 441-446).

Statistically, in this example, the exemplary mean $M_{ZR}$ within the LV can be, e.g., 0.018±0.008 vs. 0.048±0.007 vs. 0.015±0.005 vs. 0.016±0.004; standard pulse train, tailored pulse train, hybrid pulse train, BIR-4 (2×) pulse, respectively; n=45; p<0.001) and RV (0.069±0.043 vs. 0.057±0.012 vs. 0.018±0.006 vs. 0.015±0.005; standard pulse train, tailored pulse train, hybrid pulse train, BIR-4 (2×) pulse, respectively; n=45; p<0.001) can be different between the pulse groups. Within each pair of groups, the mean $M_{ZR}$ within the LV can be significantly higher for the tailored pulse train than for the other three pulses (p<0.001), and it is possible that the mean $M_{ZR}$ is not different for any pair between the standard pulse train, hybrid pulse train, and BIR-4 (2×) pulses.

The corresponding range (min-max) of $M_{ZR}$ can be, e.g., 0.009-0.054, 0.035-0.069, 0.008-0.028, and 0.010-0.027 for the standard pulse train, tailored pulse train, hybrid pulse train, BIR-4 (2×) pulse, respectively. Within the RV, the mean $M_{ZR}$ can be significantly higher for both the standard and tailored pulse trains than for either the hybrid pulse train or BIR-4 (2×) pulse (p<0.001), and not different between the standard and tailored pulse trains and between the hybrid pulse train and BIR-4 (2×) pulse. The corresponding exemplary range (min-max) of $M_{ZR}$ was 0.013-0.195, 0.026-0.079, 0.009-0.042, and 0.007-0.032 for the standard pulse train, tailored pulse train, hybrid pulse train, BIR-4 (2×) pulse, respectively. These exemplary in vivo cardiac $M_{ZR}$ results demonstrate the superior efficacy of the hybrid pulse train and BIR-4 (2×) pulses over those of the standard and tailored pulse trains.

For example, in nine subjects studied, the standard pulse train, tailored pulse train, and hybrid pulse train were capable of acquiring six slices using the aforementioned Turbo-FLASH protocol (i.e., total acquisition time=960 ms; total acquisition window=1000 ms), whereas the BIR-4 (2×) pulse was capable of acquiring only 1.4±0.5 slices within clinically acceptable SAR limits (see, e.g., Table 3). The mean SAR per slice was 7.5±0.5, 10.7±0.7, 14.2±1.3, and 50.5±4.0 for the standard pulse train, tailored pulse train, hybrid pulse train, and BIR-4 (2×) pulses, respectively. Statistically, the mean SAR per slice was significantly different between all pulse groups (p<0.001) and between each pair of groups (p<0.02). These in vivo results strongly suggest that the hybrid pulse train can be safely used for multi-slice ($\geq 6$) first-pass cardiac perfusion MRI at 3 T.

Table 3 provides exemplary mean predicted SAR and exemplary maximum allowable perfusion image acquisitions per cardiac cycle. For each saturation pulse, the SAR per slice can be calculated by, e.g., dividing the SAR measurements by the maximum permitted number of slices. The acquisition time per slice can be about 160 ms, and these measurements can be recorded with a total acquisition window of about 1000 ms (i.e., heart rate of, e.g., 60 beats per minute).

EXEMPLARY TABLE 3

|  | Standard Train | Tailored Train | Hybrid Train | BIR-4 (2×) |
|---|---|---|---|---|
| Total SAR (%) | 45.0 ± 3.2 | 64.4 ± 4.2 | 85.4 ± 8.0 | 72.0 ± 23.8 |
| Slices per cardiac cycle | 6 ± 0 | 6 ± 0 | 6 ± 0 | 1.4 ± 0.5 |
| Mean SAR per slice (%) | 7.5 ± 0.5 | 10.7 ± 0.7 | 14.2 ± 1.3 | 50.5 ± 4.0 |

A standard pulse train can yield relatively accurate $S/S_0$ for the LV and be inaccurate $S/S_0$ for the RV. An exemplary tailored pulse train can yield relatively inaccurate $S/S_0$ for both ventricles. Both the hybrid pulse train and BIR-4 (2×) pulses can produce relatively accurate $S/S_0$ for both ventricles. Further, it is possible that for $M_{ZR}$=0.02, the normalized $S \geq 1.2$ (i.e., 20% error) for $T_1 \geq 1050$ ms. These exemplary numerical results highlight the importance of uniform $T_1$-weighting in first-pass cardiac perfusion MRI, and that the examined first-pass perfusion protocol (e.g., acquisition time ~160 ms; TD=10 ms, flip angle=10°) can be relatively sensitive to $M_{ZR}$ left behind by the nominal saturation pulse for large $T_1$ values.

Exemplary Analysis

According to such exemplary embodiment of the present disclosure, it is possible to compare the efficacy of four saturation pulses: standard pulse train, tailored pulse train, hybrid pulse train, and BIR-4 (2×) pulses. Compared with the standard and tailored pulse trains, both the hybrid pulse train and BIR-4 (2×) pulses yielded more uniform saturation of magnetization ($M_{ZR} \leq 0.02$) within the whole heart (see, e.g., FIG. 5 and Table 2). These findings can be significant because $M_{ZR}$ as small as 5-7% of $M_0$ can cause significant error in the dynamic $T_1$-weighted signal (see, e.g., FIG. 7, described herein above). The influence of the saturation pulse on the accuracy the $T_1$-weighted signal was determined to be relatively high, particularly for large $T_1$ values ($\geq 1000$ ms). These findings confirm that it is critically important to perform uniform $T_1$-weighting for accurate quantification of $T_1$ from first-pass cardiac perfusion MR images.

Figure 5:
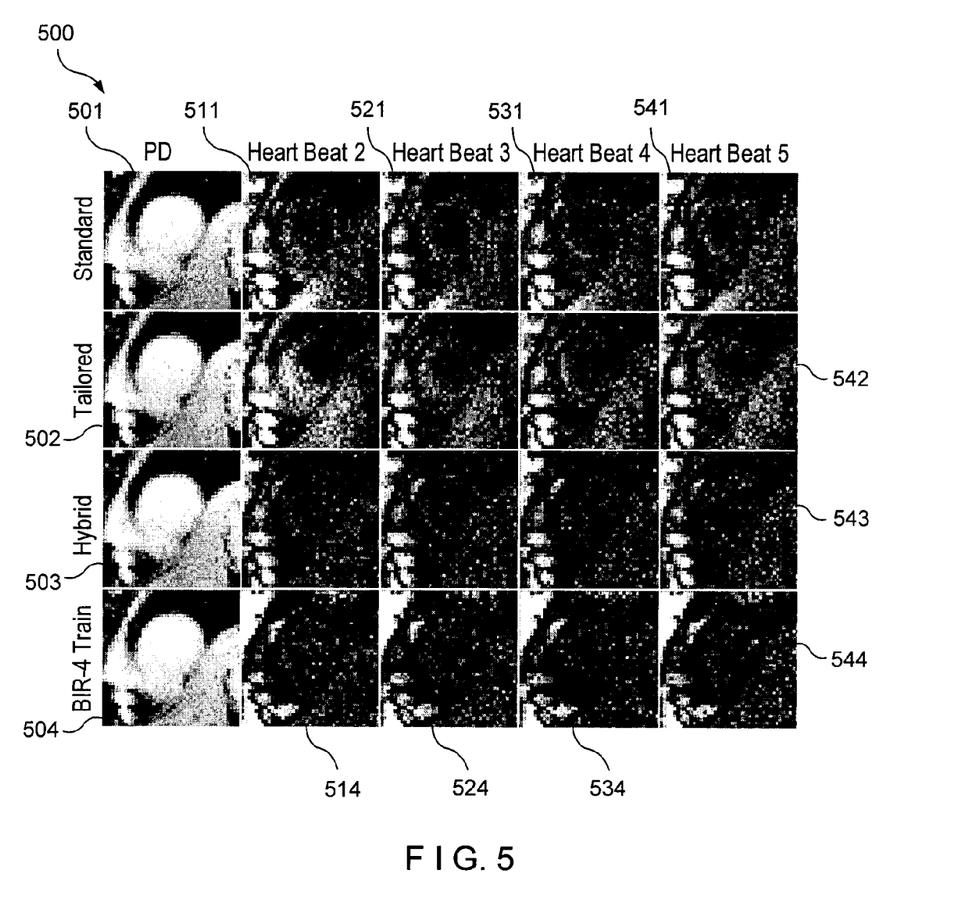
FIG. 5 is a group of illustrations providing exemplary representative repeated acquisitions of non-contrast T1-weighted images over multiple heartbeats, in accordance with the exemplary embodiments of the present disclosure.

FIG. 5 shows exemplary representative repeated acquisitions of non-contrast $T_1$-weighted images over multiple heartbeats. In this example, images 501, 511, 521, 531, 541 for a standard train, and images 502, 512, 522, 532, 542 for a tailored train. Exemplary images 503, 513, 523, 533, 543 for a hybrid train, and exemplary images 504, 514, 524, 534, 544 for a BIR-4 train. As shown in FIG. 5, the standard and tailored pulse trains can yield more residual signal compared with the hybrid and BIR-4 pulse trains. The T1-weighted images can be displayed with identically grayscales (e.g., 200-1000 in arbitrary units) to bring out regional variations.

Figure 6:
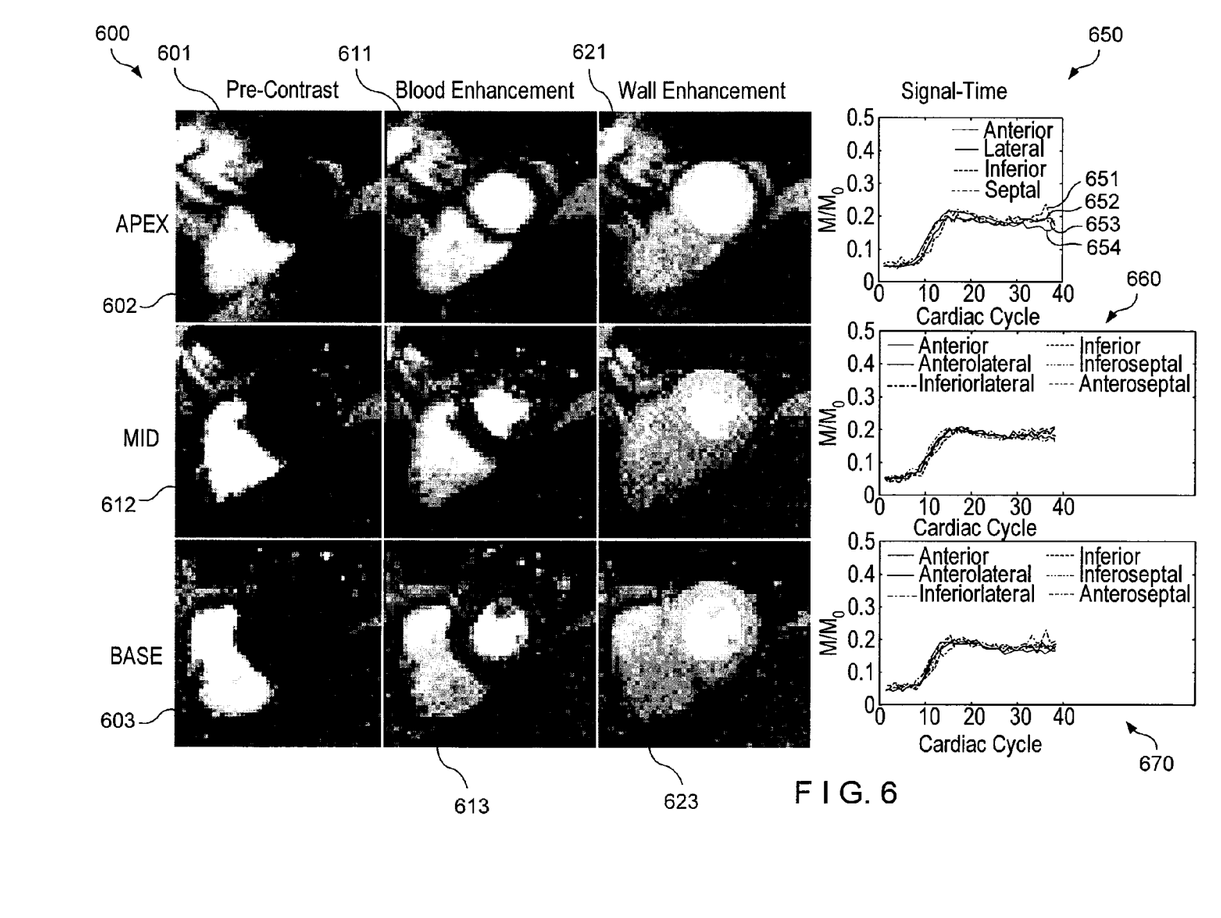
FIG. 6 is a group of illustrations that includes exemplary images of exemplary representative first-pass cardiac perfusion images acquired using an exemplary hybrid adiabatic-rectangular RF pulse, and corresponding exemplary signal versus time graphs, in accordance with the exemplary embodiments of the present disclosure.
Figure 7A:
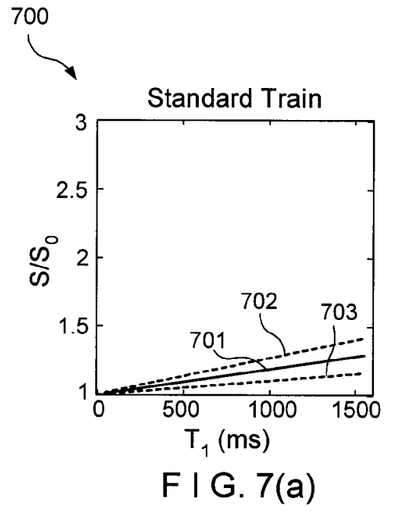
FIGS. 7(a)-7(d) are exemplary simulated plots of S/S0 as a function of T1 for left ventricle for the four saturation pulses, in accordance with the exemplary embodiments of the present disclosure.
Figure 7B:
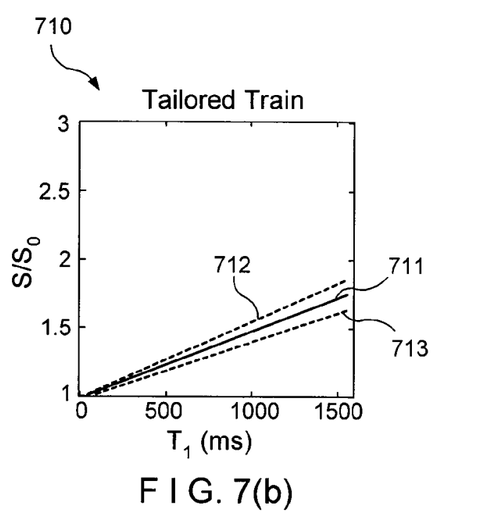
Figure 7C:
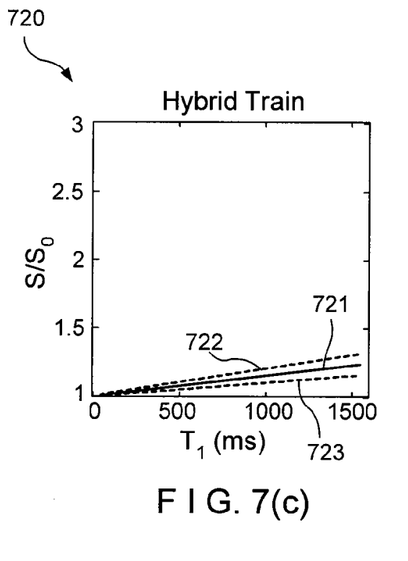
Figure 7D:
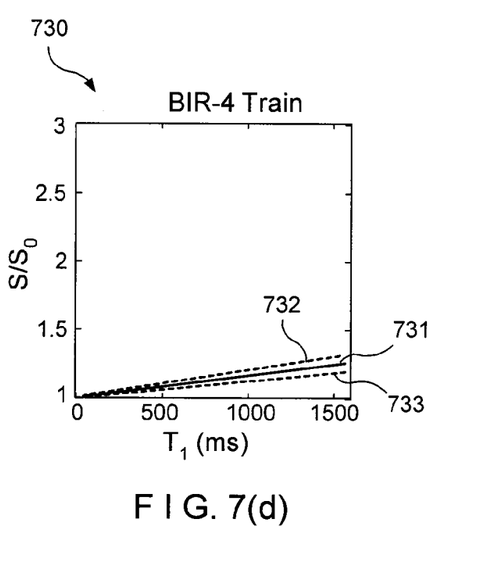

FIG. 6 shows an exemplary image array 600 that shows exemplary representative first-pass cardiac perfusion images

601, 602, 603 at pre-contrast, images 611, 612, 613 with peak blood enhancement, and 621, 622, 623 of peak myocardial wall enhancement. An exemplary hybrid pulse train can be used as a saturation pulse for images 601, 611, 621 of an apical plane of the LV, images 602, 612, 622 for a midventricular plane of the LV, and images 603, 613, 623 of a basal plane of the LV. Exemplary corresponding plots of normalized T1-weighted signal for each of 16 segments as a function of cardiac cycle are shown in exemplary graphs 650, 660 and 670 of FIG. 6. As shown by, e.g., exemplary curves 651, 652, 653, 654, there can be a strong agreement between exemplary normalized signal-time curves between four segments of the left ventricular wall. This can indicate that the hybrid pulse train can produce a uniform T1-weighted signal within the heart. According to this example, the T1-weighted images can be displayed with the same grayscales (e.g., 200-1500 in arbitrary units).

FIGS. 7(*a*)-7(*d*) show exemplary simulated graphs 700, 710, 720, 730. For example, graph 700 of FIG. 7(*a*) show simulated plots, represented by line 701, of S/S0 as a function of T1 for a LV for a standard pulse train. The graph 710 of FIG. 7(*b*) shows simulated plots, represented by line 711, of S/S0 as a function of T1 for a LV for a tailored pulse train. The graph 720 of FIG. 7(*c*) shows simulated plots, represented by line 721, of S/S0 as a function of T1 for a LV for a hybrid pulse train. The graph 730 of FIG. 7(*d*) shows simulated plots, represented by line 731, of S/S0 as a function of T1 for an exemplary BIR-4 pulse train. As shown in FIGS. 7(*a*)-7(*d*), the exemplary standard pulse train can provide a relatively accurate S/S0, whereas the exemplary tailored pulse train can provide less accurate S/S0. Compared with the standard and tailored pulse trains, both the exemplary hybrid pulse train and BIR-4 pulse train can produce more accurate S/S0. Solid lines 701, 711, 721, 731 can represent S/S0 calculated with mean in vivo $M_{ZR}$. In an exemplary graph 700 of FIG. 7(*a*), dotted lines 702, 703 represent S/S0 calculated with mean+SD and mean−SD in vivo $M_{ZR}$, respectively. In an exemplary graph 710 of FIG. 7(*b*), dotted lines 712, 713 represent S/S0 calculated with mean+SD and mean−SD in vivo $M_{ZR}$, respectively. Similarly, in exemplary graphs 720, 730 of FIGS. 7(*c*) and 7(d), dotted lines 722, 723 and 732, 733, respectively, represent exemplary S/S0 calculated with mean+SD and mean−SD in vivo $M_{ZR}$, respectively.

Figure 8:
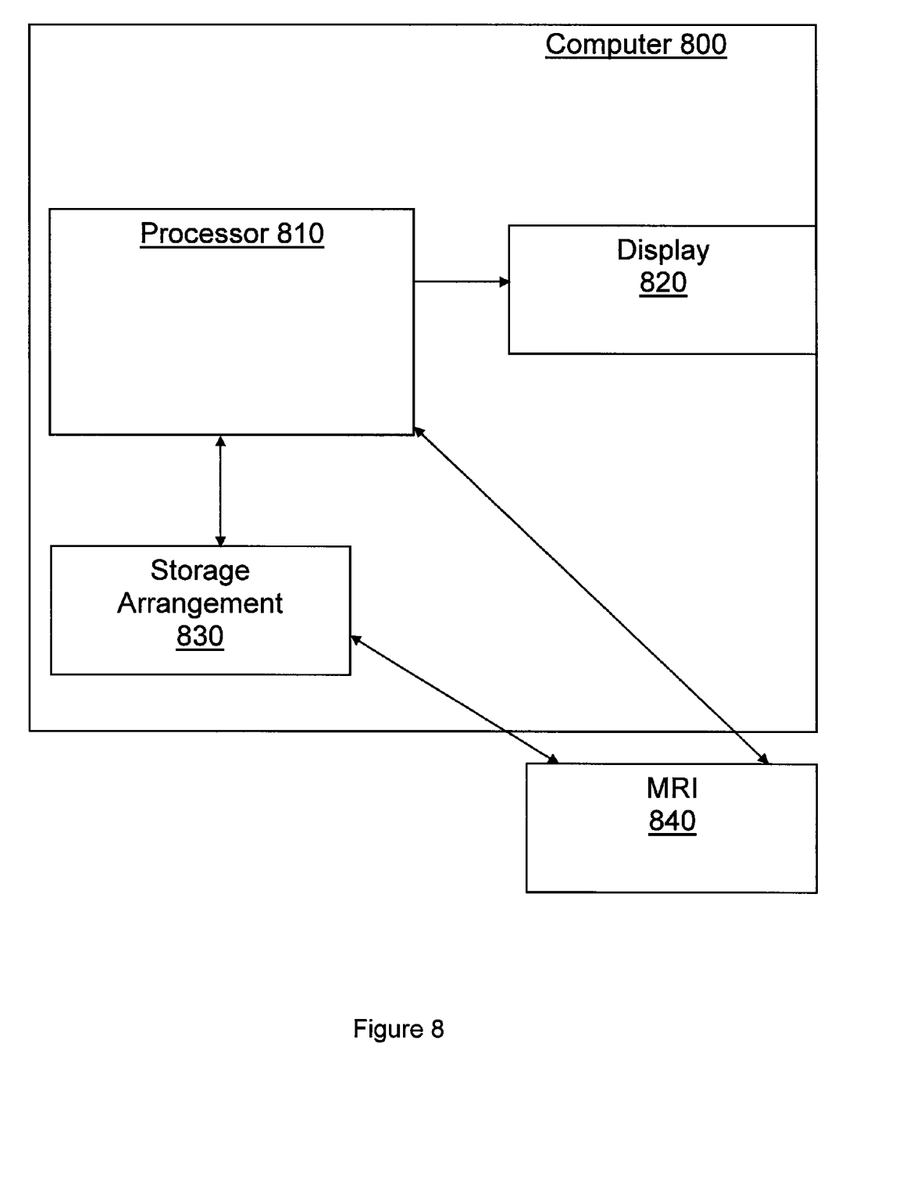
FIG. 8 is a block diagram of an exemplary embodiment of a system, in accordance with the present disclosure.

FIG. 8 illustrates a block diagram of an exemplary embodiment of a system according to the present disclosure. A computer 800 can be provided having a processor 810 which can be configured or programmed to perform the exemplary steps and/or procedures of the exemplary embodiments of the techniques described above. For example, an external device, such as a system which can include an MRI component 840, can provide measurements to the processor 810. Such data can be associated with, for example, at least one portion of an anatomical structure. Other sensors and/or external devices or arrangements can be used to provide various types of data, e.g., external processors, biological sensors, etc. According to one exemplary embodiment of the present disclosure, the data can be stored in a storage arrangement 830 (e.g., hard drive, memory device, such as RAM, ROM, memory stick, floppy drive, etc.). The processor 810 can access the storage arrangement 830 to execute a computer program or a set of instructions (stored on or in the storage arrangement 830) which perform the procedures according to the exemplary embodiments of the present disclosure.

Thus, e.g., when the processor 810 performs such instructions and/or computer program, the processor can be configured to perform the exemplary embodiments of the procedures according to the present disclosure, as described above herein. For example, the processor can receive information from the MRI 840 relating to the transmit RF calibration for a sample. This information can be received directly from the MRI 840 or accessed from the storage arrangement. The processor 810 can then determine information relating to the transmit RF calibration in a sample as a function of the received information.

Figure 9:
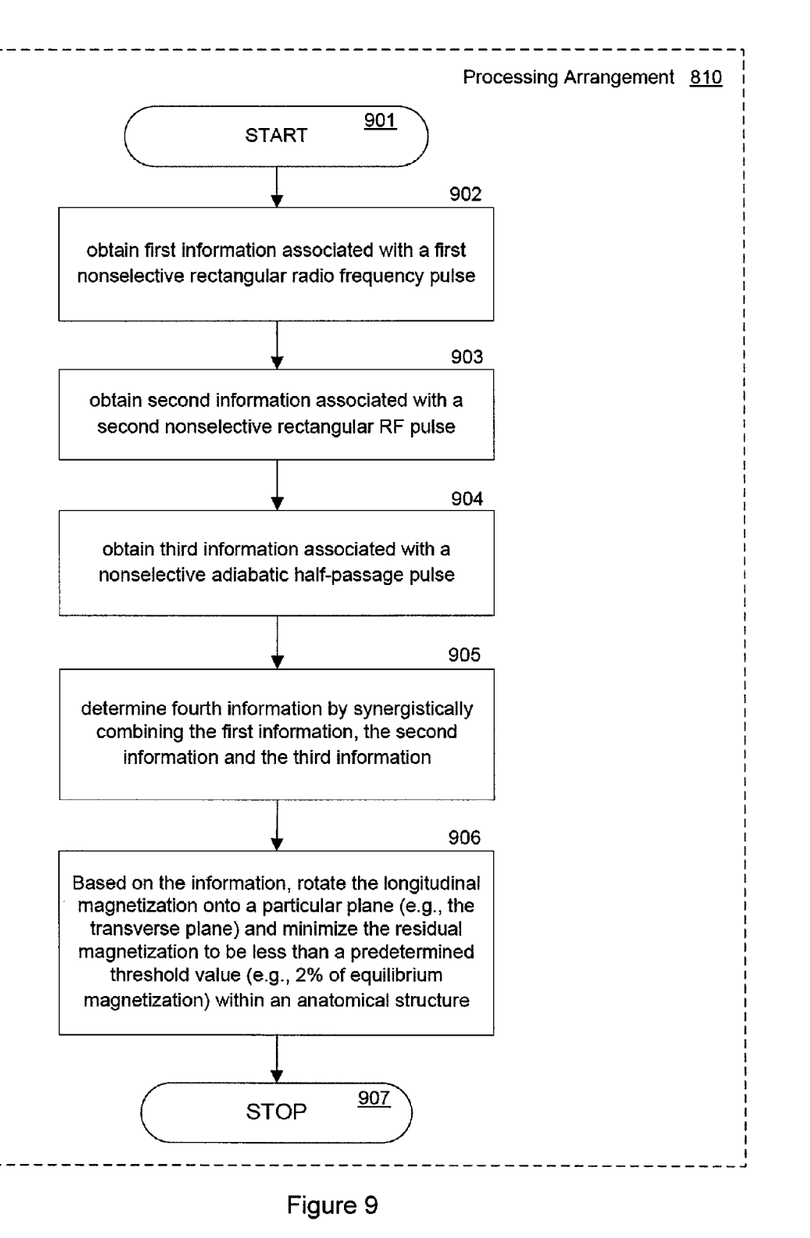
FIG. 9 is a flow diagram of an exemplary method for providing a hybrid adiabatic-rectangular pulse train for saturation of magnetization within an anatomical structure, in accordance with certain exemplary embodiments of the present disclosure.

A display 820 can also be provided for or in the exemplary system of FIG. 8. The storage arrangement 830 and the display 820 can be provided within the computer 800 or external from the computer 800. The information received by the processor 810 and the information determined by the processor 810, as well as the information stored on the storage arrangement 830 can be displayed on the display 820 in a user-readable format FIG. 9 is a flow diagram of an exemplary method for providing a hybrid adiabatic-rectangular pulse train for saturation of magnetization within an anatomical structure, in accordance with certain exemplary embodiments of the present disclosure. As shown in FIG. 9, the exemplary procedure can be executed on and/or by, e.g., the processing/computing arrangement 810. For example, starting at subprocess 901, the exemplary procedure can, in subprocess 902, obtain first information associated with a first nonselective rectangular radio frequency pulse. In subprocess 903, the exemplary procedure can obtain second information associated with a second nonselective rectangular RF pulse. Then, in subprocess 904, the exemplary procedure can obtain third information associated with a nonselective adiabatic half-passage pulse. Further, the exemplary procedure can, in subprocess 905, determine fourth information by synergistically combining the first information, the second information and the third information. In subprocess 906, the exemplary procedure based on the information can rotate the longitudinal magnetization onto a particular plane (e.g., the transverse plane) and minimize the residual magnetization to be less than a predetermined threshold value (e.g., 2% of equilibrium magnetization) within an anatomical structure.

An exemplary advantage of the hybrid pulse train according to certain exemplary embodiments of the present disclosure can be that it can be relatively insensitive to both $B_0$ and $B_1^+$ variations within the whole heart at 3 T, and, therefore, can be used in conjunction with commercially available automated $B_0$ shimming and RF calibration procedures. Its efficacy is comparable to that of the BIR-4 (2×) pulse, whereas its RF energy is about 77% less than that of the BIR-4 (2×) pulse. Exemplary results show that the extra RF power (e.g., 99% more than that of the standard pulse train) needed to employ the hybrid pulse train does not exceed the clinically acceptable SAR limits for multi-slice ($\geqq$6) first-pass cardiac perfusion MRI (see, e.g., FIG. 6 and exemplary Table 3).

Compared with the previously reported BIR-4 pulse (see, e.g., Kim D, Gonen O et al., supra.), the hybrid pulse yielded comparable $M_{ZR}$ within the LV and comparatively less $M_{ZR}$ within the RV, and its RF energy is 54% less than that of the BIR-4 pulse (data not shown). The exemplary analysis was performed using the same Siemens whole-body 3 T system. For comparison with the original tailored pulse train described by Sung et al. (see, e.g., Sung et al., *Measurement and characterization of RF nonuniformity over the heart at 3 T using body coil transmission*, Journal of Magnetic Resonance Imaging, 27(3):643-648 (2008)), the commercially available automated $B_0$ shimming and RF calibration procedures can be likely to differ between their GE whole-body 3 T system than the utilized Siemens system. In addition, the publication of Sung et al. (see, e.g., Sung K et al., Design and use of tailored hard-pulse trains for uniform saturation of myocardium at 3 Tesla, Magnetic Resonance in Medicine 2008; 60:997-1002) described a measurement of relative $M_{ZR}$, because both SR and PD images were only acquired with two "shots" segmented over two heart beats, and with only one heartbeat for magnetization recovery between the SR and PD acquisitions. Therefore, it may be difficult to directly compare their relative $M_{ZR}$ measurements with our corresponding absolute $M_{ZR}$ measurements. The exemplary hybrid pulse train configuration according to the exemplary embodiments of the present disclosure can be based on $B_0$ variation of, e.g., 260 Hz, as reported by Schar et al. (see, e.g., Schar M et al., supra.) using a Philips whole-body 3 T system, and $B_1^+$ scale of 0.5-1.1, as reported by Sung et al. (see, e.g., Sung K et al., *Measurement and characterization of RF non-uniformity over the heart at 3T using body coil transmission*, Journal of Magnetic Resonance Imaging 2008; 27(3):643-648) using a GE whole-body 3 T system. Despite the lack of direct cardiac $B_1^+$ scale and $B_0$ offset measurements from a Siemens 3 T system, the exemplary hybrid pulse train have performed well within the entire heart in all nine subjects as described herein.

The exemplary hybrid pulse train can also be used for a variety of applications, e.g., where a non-selective saturation pulse is used to prepare the longitudinal magnetization prior to imaging. For example, one application is renal first-pass perfusion MRI, where a saturation pulse can be used to achieve $T_1$ weighting similarly to in cardiac first-pass perfusion MRI. In addition, it can be used in an Look-Locker approach to measure $T_1$, where the benefit of a saturation pulse over an inversion pulse would be that the former is insensitive to heart rate variability (23) and that the sign of the image signal can be always positive. The exemplary hybrid pulse train can also be used in a SR double angle method for rapid $B_1$ mapping (16).

The foregoing merely illustrates the principles of the present disclosure. Various modifications and alterations to the described embodiments will be apparent to those having ordinary skill in art the in view of the teachings herein. It will thus be appreciated that those having ordinary skill in art will be able to devise numerous systems, arrangements, and methods which, although not explicitly shown or described herein, embody the principles of the disclosure and are thus within the spirit and scope of the disclosure. In addition, all publications and references referred to above are incorporated herein by reference in their entireties. It should be understood that the exemplary procedures described herein can be stored on any computer accessible medium, including a hard drive, RAM, ROM, removable disks, CD-ROM, memory sticks, etc., and executed by a processing arrangement which can be a microprocessor, mini, macro, mainframe, etc. In addition, to the extent that the prior art knowledge has not been explicitly incorporated by reference herein above, it is explicitly being incorporated herein in its entirety. All publications referenced above are incorporated herein by reference in their entireties.

What is claimed is:

1. A non-transitory computer-accessible medium having instructions thereon for providing a hybrid adiabatic-rectangular pulse train for saturation of a longitudinal magnetization within an anatomical structure, wherein, when a computing arrangement executes the instructions, the computing arrangement is configured to:
    determine information by combining a first information associated with a first nonselective rectangular radio frequency (RF) pulse, a second information associated with a second nonselective rectangular RF pulse, and a third information associated with a nonselective adiabatic half-passage pulse;
    rotate the longitudinal magnetization onto a particular plane based on the information; and
    achieve an adjusted residual longitudinal magnetization based on the information to be less than a predetermined threshold value within the anatomical structure using a configuration of RF pulses.

2. The non-transitory computer-accessible medium of claim 1, wherein the particular plane is a transverse plane.

3. The non-transitory computer-accessible medium of claim 1, wherein the predetermined threshold value is approximately 2% of an equilibrium magnetization.

4. The non-transitory computer-accessible medium of claim 1, wherein the first nonselective rectangular RF pulse is configured to produce a lower RF energy deposition than the second nonselective rectangular RF pulse.

5. The non-transitory computer-accessible medium of claim 1, wherein the second nonselective rectangular RF pulse is configured to produce a lower RF energy deposition than the first nonselective rectangular RF pulse.

6. The non-transitory computer-accessible medium of claim 1, wherein the nonselective adiabatic half-passage pulse is configured to produce a higher RF energy deposition than the first nonselective rectangular RF pulse or of the second nonselective rectangular RF pulse.

7. The non-transitory computer-accessible medium of claim 1, wherein the first and second nonselective rectangular RF pulses are configured to produce lower RF energy deposition than the nonselective adiabatic half-passage pulse.

8. The non-transitory computer-accessible medium of claim 1, wherein the saturation of the longitudinal magnetization using a hybrid adiabatic-rectangular pulse train includes a transmission of an RF field to a subject.

9. The non-transitory computer-accessible medium of claim 1, wherein the saturation of the longitudinal magnetization with a hybrid adiabatic-rectangular pulse train includes a utilization of a body coil configured to be used in a magnetic field of at least 3 Tesla.

10. The non-transitory computer-accessible medium of claim 9, wherein the saturation of the longitudinal magnetization with a hybrid adiabatic-rectangular pulse train includes a utilization of a local transmit coil configured to be used in a magnetic field of at least 7 Tesla.

11. The non-transitory computer-accessible medium of claim 10, wherein the saturation of the longitudinal magnetization with a hybrid adiabatic-rectangular pulse train includes a utilization of a local transmit coil configured to be used in a magnetic field of at least 11 Tesla.

12. The non-transitory computer-accessible medium of claim 1, wherein the rotation of the longitudinal magnetization onto the transverse plane is influenced by expected RF field and static magnetic field inhomogeneities within the anatomical structure .

13. The non-transitory computer-accessible medium of claim 1, wherein the computing arrangement is further configured to generate an image of the anatomical structure based on information associated with uniform saturation of the magnetization.

14. The non-transitory computer-accessible medium of claim 13, wherein the computing arrangement is further configured to extend spatial coverage for saturation of magnetization such that multiple regions of interest associated with the image can be utilized.

15. The non-transitory computer-accessible medium of claim 1, wherein the usage utilizes a predetermined specific absorption rate that is within clinically acceptable safe limits for use with an acquisition of multiple slices per heart beat.

16. A method for providing a hybrid adiabatic-rectangular pulse train for saturation of magnetization within an anatomical structure, comprising: passage pulse;

determining information by combining a first information associated with a first nonselective rectangular radio frequency (RF) pulse, a second information associated with a second nonselective rectangular RF pulse, and a third information associated with a nonselective adiabatic half-passage pulse;

rotating the longitudinal magnetization onto a particular plane based on the information; and     using a computer hardware arrangement, achieving an adjusted residual longitudinal magnetization based on the information to be less than a predetermined threshold value within the anatomical structure using a configuration of RF pulses.

17. The method of claim 16, wherein the particular plane is a transverse plane.

18. The method of claim 16, wherein the predetermined threshold value is approximately 2% of an equilibrium magnetization.

19. The method of claim 16, further comprising at least one of displaying or storing at least one of (i) the first information, (ii) the second information, (iii) the third information, (iv) the information, (v) the adjusted residual longitudinal magnetization based on the information, or (vi) further information associated with the anatomical structure in a storage arrangement in at least one of a user-accessible format or a user-readable format.

20. A system for providing a hybrid adiabatic-rectangular pulse train for saturation of magnetization within an anatomical structure, comprising:

a non-transitory computer-accessible medium having executable instructions thereon, wherein when at least one computing arrangement executes the instructions, the at least one computing arrangement is configured to:

determine information by combining a first information associated with a first nonselective rectangular radio frequency (RF) pulse, a second information associated with a second nonselective rectangular RF pulse, and a third information associated with a nonselective adiabatic half-passage pulse;

rotate the longitudinal magnetization onto a particular plane based on information; and     achieve an adjusted residual longitudinal magnetization based on the information to be less than a predetermined threshold value within the anatomical structure using a configuration of RF pulses.

21. The system of claim 20, wherein the particular plane is a transverse plane.

22. The system of claim 20, wherein the predetermined threshold value is approximately 2% of an equilibrium magnetization.

* * * * *